United States Patent [19]

Elias et al.

[11] 4,297,257

[45] Oct. 27, 1981

[54] METAL STRIPPING COMPOSITION AND METHOD

[75] Inventors: Moenes L. Elias, Canfield; Narendra K. Shah, Youngstown, both of Ohio

[73] Assignee: Dart Industries Inc., Los Angeles, Calif.

[21] Appl. No.: 141,013

[22] Filed: Apr. 17, 1980

[51] Int. Cl.$^3$ .................. C08L 33/26; C09K 13/08
[52] U.S. Cl. .................. 260/29.6 H; 252/19.3; 252/79.4; 156/634
[58] Field of Search .................. 260/29.6 N, 29.6 H; 156/634, 666; 252/79.3, 79.4

[56] References Cited

U.S. PATENT DOCUMENTS

| | | | |
|---|---|---|---|
| 3,888,778 | 6/1975 | Beckwith et al. | 252/79.4 |
| 3,898,037 | 8/1975 | Lange et al. | 134/41 |
| 3,926,699 | 12/1975 | Dixon | 156/3 |

*Primary Examiner*—John Kight, III
*Assistant Examiner*—Amelia B. Yarbrough
*Attorney, Agent, or Firm*—Bryant W. Brennan; Harold R. Beck

[57] ABSTRACT

A composition for stripping solder and tin from a copper substrate having an extended life is provided by the inclusion of a polyacrylamide in a peroxide-fluoride based stripping composition. The presence of the polyacrylamide minimizes the adverse effect of the stripping composition on the copper substrate of the material undergoing treatment.

12 Claims, No Drawings

METAL STRIPPING COMPOSITION AND METHOD

BACKGROUND OF THE INVENTION

Various compositions including acids have been used to strip solder from a copper substrate. In the use of such prior available compositions, the workpiece must be exposed to the composition for a relatively long period of time to effectively strip the solder. Within this relatively long period the stripping composition can adversely affect the copper substrate. This requires that the copper substrate be further treated in order that it will be in a suitable condition to receive further plating.

In one approach to overcoming the noted disadvantages, U.S. Pat. No. 3,841,905 discloses a stripping composition comprising ammonium bifluoride and hydrogen peroxide. U.S. Pat. No. 3,926,699 discloses an improvement an improvement on the compositions of U.S. Pat. No. 3,841,905 wherein a hydrogen peroxide stabilizer and/or a soluble metal complexer is included in the base compositions.

SUMMARY OF THE INVENTION

In accordance with the present invention, the attack of stripping solutions based upon hydrogen peroxide and hydrofluoric acid or its salts upon the copper substrate of copper materials is minimized or inhibited by the inclusion of a polyacrylamide in the stripping solutions. This results in an advantageous extension of the life of the bath.

The inclusion of a polyacrylamide in the stripping solutions according to the present invention does not adversely affect the attack of the stripping solution on tin or lead-tin plated to a copper substrate.

The particular copper-bassed material undergoing stripping is handled in accordance with conventional stripping practice, that is, it is exposed to the action of the stripping solution, then flushed to remove the material being stripped together with the stripping solution and the copper metal subsequently handled in accordance with the desired objective. For example, it may then be plated with another metal using conventional techniques.

One particular area of use for the compositions of the present invention would be in the preparation of printed circuit boards wherein the terminal tabs of the board are stripped of tin or solder before plating with a more noble metal.

DESCRIPTION OF THE PREFERRED EMBODIMENTS

The compositions of the present invention exhibit the desired stripping activity on the tin or solder and are further characterized in that they have no detrimental effect on the copper substrate of the copper-based material undergoing treatment and provide an extended bath life.

The compositions of the present invention are based upon the discovery that the inclusion of a polyacrylamide in a stripping solution comprising hydrogen peroxide and hydrofluoric acid or a salt thereof will minimize or eliminate attack of the stripping solution on the copper present.

In a preferred embodiment of the present invention the stripping solution will comprise an aqueous solution of hydrogen peroxide and ammonium bifluoride containing a polyacrylamide. These components can be present in a range of from about 5% to about 50% of ammonium bifluoride; from about 0.5% to about 35% of hydrogen peroxide; and from about 0.01% to about 10% of polyacrylamide; the balance being water. For optimum results the ammonium bifluoride is employed in a range of from about 10% to about 30%; the hydrogen peroxide in a range of from about 2% to about 10%; and the polyacrylamide in a range of from about 0.05% to about 1.0%.

Ammonium bifluoride is a preferred salt of hydrofluoric acid. However, the invention is not limited to this specific salt, as any reactive composition of ammonia and hydrofluoric acid or salts thereof can be employed. For example, a mixture of ammonium halides with hydrofluoric acid is satisfactory.

The hydrogen peroxide is merely an example of a convenient oxygen source needed to support the reaction of the acid on the solder. Other suitable oxygen sources can be substituted. Examples are tert-butyl hydro-peroxide and sodium or ammonium perborate.

While polyacrylamide itself has been used for purposes of illustration, other substituted polyacrylamides may be similarly employed. For purposes of use in accordance with the present invention the polyacrylamide component will have a molecular weight of from about 2,000 to about 5,000,000.

Other conventional components of stripping compositions can be present in the compositions of the present invention. Thus, the use of peroxide stabilizers is contemplated and other known stripping agents can be present. For example, trichloroacetic acid can be included and is present in the illustrative example of a stripping solution set forth below.

EXAMPLE

A 300 ml stripping solution is prepared by adding ammonium bifluoride, trichloroacetic acid and 50% hydrogen peroxide to water, the components being added in an amount to provide the following concentration:

| Ammonium bifluoride | 234 gm/liter |
| Trichloroacetic acid | 15 gm/liter |
| 50% Hydrogen peroxide | 14.6% by volume, |
| the balance being water. | |

The resulting solution is divided into two (2) 150 ml portions. The first of these portions, Solution A, is composed of the untreated original solution. Solution B contains added polyacrylamide having a molecular weight of 660,000 in the amount of 0.3 gms/liter.

Seven (7) 2 inch by 2 inch specimens of copper clad laminate are then placed in each of Solution A and Solution B. The following results were noted:

TABLE I

| Solution | Polyacrylamide | Initial Wt | Wt after 20 min Immersion | Loss in wt after 20 min Immersion | Wt after 40 min Immersion | Loss in wt after 40 min Immersion |
| --- | --- | --- | --- | --- | --- | --- |
| A | None | 54.7865 | 53.4904 | 1.2961 | 52.8626 | 1.9239 |
| B | .3g/l | 55.8490 | 55.2298 | .6192 | 54.9369 | .9121 |

TABLE II

| Solution | Concentration by Volume of 50% Hydrogen Peroxide after 20 Minutes | Concentration by Volume of 50% Hydrogen Peroxide after 40 Minutes |
|---|---|---|
| A | 9.4 | 6.6 |
| B | 11.05 | 8.74 |

The results reported in Table I demonstrate that the presence of polyacrylamide in Solution B has inhibited the attack of the stripping solution upon the copper component of the laminate.

The results reported in Table II demonstrate that the inclusion of polyacrylamide in Solution B has significantly enhanced the bath life of the stripping solution.

It will be obvious to those skilled in the art that various modifications can be made to the specific embodiments discussed above. All such departures from the foregoing specification are considered to be within the scope of this invention as disclosed by this specification and defined by the appended claims.

What is claimed is:

1. An aqueous stripping solution which contains in solution from about 0.5% to about 35% of hydrogen peroxide, from about 5% to about 50% of a reactive composition of ammonia and hydrofluoric acid or a salt thereof, and from about 0.01% to about 10% of a polyacrylamide.

2. An aqueous stripping solution which contains in solution from about 2% to about 10% of hydrogen peroxide, from about 10% to about 30% of ammonium bifluoride, and from about 0.05% to about 1.0% of a polyacrylamide.

3. A composition according to claim 2 wherein the polyacrylamide has a molecular weight of from about 2,000 to about 5,000,000.

4. A composition according to claim 3 wherein trichloroacetic acid is present in solution.

5. A composition according to claim 4 wherein the trichloroacetic acid is present in an amount of about 0.01% to about 10%.

6. A composition according to claim 3 wherein the polyacrylamide is polyacrylamide.

7. An aqueous stripping solution which contains 21% of ammonium bifluoride, 1% of trichloroacetic acid, 7% of hydrogen peroxide and 0.2% of polyacrylamide.

8. The method of rapidly stripping a layer of metal selected from the group consisting of lead-tin solder and tin from a layer of copper without adversely affecting the copper, said process comprising the steps of exposing the solder to a composition comprising from about 0.05% to about 35% of hydrogen peroxide, from about 5% to about 50% of a reactive composition of ammonia and hydrofluoric acid or a salt thereof, and from about 0.01% to about 10% of a polyacrylamide for a time sufficient to remove the solder, and rinsing the said composition from the copper after the solder has been effectively stripped and before the copper has been adversely affected.

9. The method of rapidly stripping a layer of metal selected from the group consisting of lead-tin solder and tin from a layer of copper without adversely affecting the copper, said process comprising the steps of exposing the solder to a composition comprising from about 2% to about 10% of hydrogen peroxide, from about 10% to about 30% of ammonium bifluoride, and from about 0.05% to about 1.0% of a polyacrylamide for a time sufficient to remove the solder, and rinsing the said composition from the copper after the solder has been effectively stripped and before the copper has been adversely affected.

10. A method according to claim 8 wherein the polyacrylamide has a molecular weight of from about 2,000 to about 5,000,000.

11. A method according to claim 9 wherein trichloroacetic acid is also present in the composition.

12. The method of rapidly stripping a layer of metal selected from the group consisting of lead-tin solder and tin from a layer of copper without adversely affecting the copper, said process comprising the steps of exposing the solder to a composition comprising about 21% of ammonium bifluoride, about 1% of trichloroacetic acid, about 7% of hydrogen peroxide and about 0.2% of polyacrylamide for a time sufficient to remove the solder, and rinsing the said composition from the copper after the solder has been effectively stripped and before the copper has been adversely affected.

* * * * *